United States Patent [19]  
Masuda et al.

[11] Patent Number: 4,656,429  
[45] Date of Patent: Apr. 7, 1987

[54] VOLTAGE COMPARISON CIRCUIT WITH RIPPLE COMPONENT ELIMINATION

[75] Inventors: Eiji Masuda, Kawasaki; Kenji Matsuo, Yokohama, both of Japan

[73] Assignee: Tokyo Shibaura Denki Kabushiki Kaisha, Kawasaki, Japan

[21] Appl. No.: 455,797

[22] Filed: Jan. 5, 1983

[30] Foreign Application Priority Data

Jan. 14, 1982 [JP] Japan ............. 57-4730

[51] Int. Cl.⁴ ............ H03K 5/22; H03F 3/16; H03B 1/00
[52] U.S. Cl. .................... 328/149; 307/352; 307/355; 307/501; 328/167; 330/277; 330/107
[58] Field of Search ........... 307/350, 530, 352, 353, 307/355, 240, 279, 496, 542, 543, 451, 469, 520, 501; 330/51, 107, 264, 267; 328/128, 165, 149, 167

[56] References Cited

U.S. PATENT DOCUMENTS

| 3,586,989 | 6/1971 | Wheable | 307/572 |
| 3,676,702 | 7/1972 | McGrogan, Jr. | 307/235 |
| 3,815,039 | 6/1974 | Fujisawa et al. | 328/167 |
| 3,904,975 | 9/1975 | Satoh | 307/546 |
| 4,063,182 | 12/1977 | Besson | 307/353 |
| 4,075,509 | 2/1978 | Redfern | 307/251 |
| 4,100,502 | 7/1978 | Yamashiro | 330/264 |
| 4,191,900 | 3/1980 | Redfern et al. | 307/240 |
| 4,211,942 | 7/1980 | Aoki et al. | 307/355 |
| 4,300,104 | 11/1981 | Tanaka et al. | 330/284 |
| 4,323,798 | 4/1982 | Watkins | 328/167 |
| 4,390,847 | 6/1983 | Yamada et al. | 330/284 |
| 4,396,890 | 8/1983 | Kato et al. | 330/107 |
| 4,461,965 | 7/1984 | Chin | 307/355 |

OTHER PUBLICATIONS

Japanese Patent Publication (KOKOKU) No. 47-25174 filed Aug. 9, 1968.

Primary Examiner—Stanley D. Miller  
Assistant Examiner—Timothy P. Callahan  
Attorney, Agent, or Firm—Finnegan, Henderson, Farabow, Garrett & Dunner

[57] ABSTRACT

A voltage comparison circuit having an amplification circuit which includes an inverting amplifier and a switching MOS transistor for setting an operation point of the inverting amplifier connected between input and output terminals of the inverting amplifier. The amplification circuit further includes at least one low-pass filter connected in a closed loop including the inverting amplifier and the switching MOS transistor.

1 Claim, 9 Drawing Figures

VOLTAGE COMPARISON CIRCUIT WITH RIPPLE COMPONENT ELIMINATION

BACKGROUND OF THE INVENTION

This invention relates to an amplification circuit, particularly to an amplification circuit used in a voltage comparison circuit of a chopper type or an auto-zero-sampled data type.

With the developments in integrated analog circuits such as integrated analog-digital conversion circuits, etc., high performance is required for a voltage comparison circuit incorporated in such a circuit. Among the characteristics in such a voltage comparison circuit, greater importance is attached to high speed response characteristics, offsetless characteristics and high resolution characteristics.

In FIG. 1 there is shown a conventional voltage comparison circuit called a chopper or auto-zero-sampled data type comparison circuit. This type of voltage comparison circuit comprises two n-channel MOS transistors TR1 and TR2, one end of each of which is connected to one electrode of a capacitor C1, wherein the other end of the former is connected to a voltage input terminal VI1 and that of the latter is connected to the other voltage terminal VI2, respectively, and an amplification circuit whose input terminal is connected to the other electrode of the capacitor C1. This amplification circuit comprises an inverting amplifier 3 and an n-channel MOS transistor TR3 connected between input and output terminals of the inverting amplifier 3.

Clock signals CP1, CP2 and CP3 are fed to the gates of the n-channel MOS transistors TR1, TR2, and TR3, respectively. Further, there is a parasitic capacitor CS2 between gate and drain of the MOS transistor TR3, and a parasitic capacitor CS3 between the input and output terminals of the inverting amplifier 3.

An example of an application of the voltage comparison circuit shown in FIG. 1, for example, is disclosed in the "A Monolithic Charge-Balancing Successive Approximation A/D Technique" by Thomas P. Redfern et al IEEE Journal, Solid-State Circuit, Vol. SC-14, pp 912–920, Dec. 1979.

Each of operation cycles of the voltage comparison circuit shown in FIG. 1 is, as shown in FIG. 2A, divided into a period for setting operation point and a voltage comparison period. Initially, at each starting time of the operation point setting period of respective operating cycles, as shown in FIG. 2B, a first clock signal CP1 is set to a high level, a second clock signal CP2 is held, as shown in FIG. 2C, at a low level, and a third clock signal CP3 is set to a high level, as shown in FIG. 2D.

In this case, in response to the third clock signal CP3 the MOS transistor TR3 becomes conductive, the input and the output terminals of the inverting amplifier 3 are short-circuited through the MOS transistor TR3, and the potentials at the input and output terminals of the inverting amplifier 3 are converged to an inversion threshold voltage value VTH.

At the same time in response to the first clock signal CP1 the MOS transistor TR1 is rendered conductive and an input voltage V1 at the input terminal VI1 is applied to the capacitor C1 through the MOS transistor to charge the capacitor C1.

Next, during this operation point setting period, at first the third clock signal CP3 is set to a low level, and following to this, the first clock signal CP1 is set to the low level. These clock signals CP1 and CP3 are held at the low level for the following voltage comparison period. Further, at the starting time of this voltage comparison period, the second clock signal CP2 is set to the high level.

According to the above described operation, the MOS transistor TR2 becomes conductive and an input voltage V2 is applied to the capacitor C1 through this MOS transistor TR2.

In consequence a voltage corresponding to a voltage difference VD between the input voltage V1 and the input voltage V2 is applied to the input terminal of the inverting amplifier 3, and from the inverting amplifier 3 an output voltage corresponding to this voltage difference is obtained.

Now suppose that the voltage difference VD between the input voltages V1 and V2 in the preceding operation cycle is, for example, as shown in FIG. 2E, a positive value such as +10 mV and it changes to a negative value, for example, −3 mV in the succeeding cycle. At the starting time of the operation point setting period in the succeeding operation cycle, when the third clock signal CP3 is set to the high level (not shown in FIG. 2D) there is included a ripple component in this third clock signal CP3, and the ripple component is transmitted to the input and output terminals of the inverting amplifier 3 through the parasitic capacitors CS1 and CS2 by a feed through effect, respectively.

In consequence the potential at the input terminal of the inverting amplifier 3, as shown in FIG. 2F, converges to the threshold voltage value VTH while fluctuating around the threshold voltage value.

When the ripple component in the high level of the third clock signal CP3 is superposed on the input voltage of the inverting amplifier 3, the inverting amplifier 3 inverts this high level input voltage. Accordingly, an output voltage V3 of this inverting amplifier 3 is reduced sharply, as shown in FIG. 2G, to the low level.

The output voltage V3 reduced to the low level is superposed on the input voltage of the inverting amplifier 3 through the parasitic capacitor CS3 by a feed through effect.

Consequently, this input voltage becomes lower than the threshold voltage value VTH, and the inverting amplifier 3 inverts the low level input voltage and generates a high level output voltage.

A similar inverting-amplifying operation by the inverting amplifier 3 is repeatedly carried out. This inverting-amplifying operation by the amplifier 3 is repeatedly carried out until the input voltage becomes equal to the inversion threshold voltage value VTH. But the operation point setting period is limited to a predetermined length, so that at the completion time of this operation point setting period, that is, at the starting time of the voltage comparison period, an offset voltage VOS with respect to the inverse threshold voltage value VTH is applied to the input terminal of the inverting amplifier 3, undesirably influencing the voltage comparison operation. In other words, in the voltage comparison period, the time in which the output voltage of the inverting amplifier 3 converges to a voltage level corresponding to the voltage difference VD between the input voltages V1 and V2 becomes longer.

A broken line shown in FIG. 2G is an output voltage which will be generated by the inverting amplifier 3, when the third clock signal CP3 containing no ripple component is set to the high level. In this case the output voltage of the inverting amplifier 3 is quickly inverted to approach the threshold voltage value VTH, and during the voltage comparison period it approaches a voltage corresponding to the voltage difference VD, and quickly becomes equal to the threshold voltage value VTH.

Conventionally, many attempts have been proposed in which size of the third MOS transistor TR3 is enlarged to reduce ON resistance, that is, to reduce the resistance of the transistor in the conductive state so that an input voltage to the inverting amplifier 3 can be quickly set close to the inversion threshold voltage value during the operation point setting period, and/or size of an MOS transistor composing the inverting amplifier 3 is enlarged to increase the gain of the inverting amplifier 3.

However, enlarging the size of the third MOS transistor TR3 results in an increase in the parasitic capacitances CS1 and CS2, and also enlarging the size of the MOS transistor constituting the inverting amplifier 3 causes an increase in the parasitic capacitance CS3. Thus, the input voltage of the inverting amplifier 3 is prevented from quickly becoming equal to the inversion threshold voltage value VTH.

Thus, conventionally, in order to set the input voltage for the inverting amplifier 3 equal to the inversion threshold voltage value VTH in the operation point setting period, it is required to lengthen the operation point setting period, lowering the operation speed. When the operation setting period is set short, the comparison operation will be initiated before an input voltage to the inverting amplifier 3 sufficiently converges with the inversion threshold VTH undesirably lowering comparison resolution.

SUMMARY OF THE INVENTION

It is an object of the present invention to provide an amplifier circuit having high speed response characteristics.

According to an embodiment of the present invention, an amplification circuit is provided which comprises amplifying means, switching means connected between input and output terminals of the amplifying means for setting an operation point of the amplifying means and at least one low-pass filter circuit connected in a closed loop which includes the amplifying means and the switching means.

DETAILED DESCRIPTION OF THE PREFERRED EMBODIMENT

Figure 3:
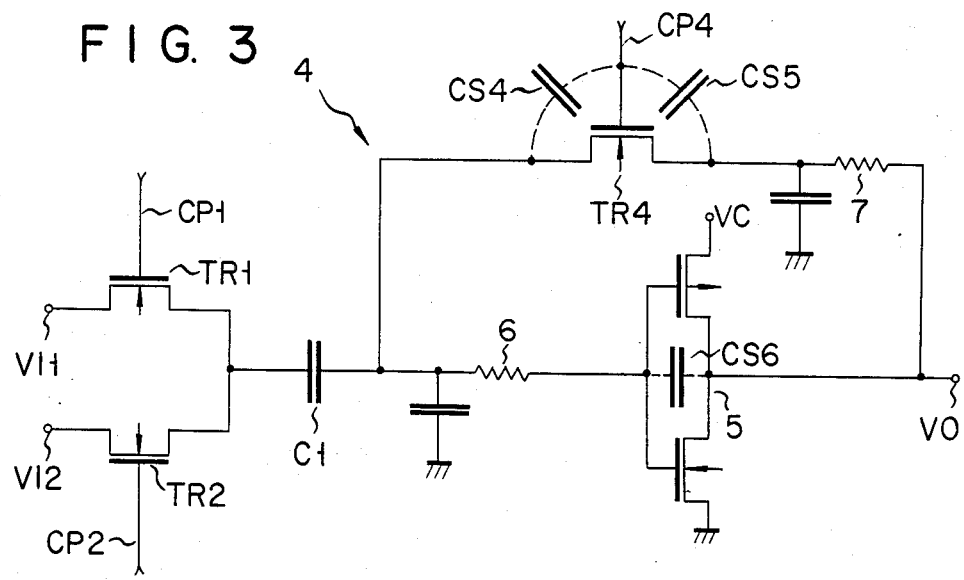
FIG. 3 is a circuit diagram of a chopper type voltage comparison circuit in which an amplification circuit according to an embodiment of the present invention is used.

In FIG. 3 there is shown a voltage comparison circuit having an amplification circuit according to one embodiment of this invention. This voltage comparison circuit includes, as is also shown in FIG. 1, two n-channel MOS transistors TR1 and TR2 whose current paths are connected at one end to one electrode of a capacitor C1, the other end of the former being connected to an input voltage terminal VI1 and that of the latter being connected to an input voltage terminal VI2, and an amplification circuit 4 having an input terminal connected to the other electrode of the capacitor C1.

The amplification circuit 4 is formed of an inverting amplifier 5, a first low-pass filter 6 connected between an input terminal of the inverting amplifier 5 and the other electrode of the capacitor C1, an n-channel switching MOS transistor TR4 whose current path is connected at one end to the other electrode of the capacitor C1, and a second low-pass filter 7 connected between the other end of the current path of this MOS transistor 4 and the output terminal of the inverting amplifier 5. The inverting amplifier 5 is, for example, a CMOS inverter formed of p- and n-channel MOS transistors whose current paths are connected between the power source terminal VC and ground. Further, each of the low-pass filters 6 and 7 may be a CR filter circuit formed of a capacitor and a resistor.

Clock pulses CP1, CP2 and CP4 are supplied to the gates of the M0S transistors TR1, TR2 and TR4, respectively. A parasitic capacitance CS4 is associated between the gate and drain of the MOS transistor TR4, a parasitic capacitance CS5 is associated between the gate and source of the MOS transistor TR4, and a parasitic capacitance CS6 is associated between the input and output terminals of the inverting amplifier 5.

Figure 1:
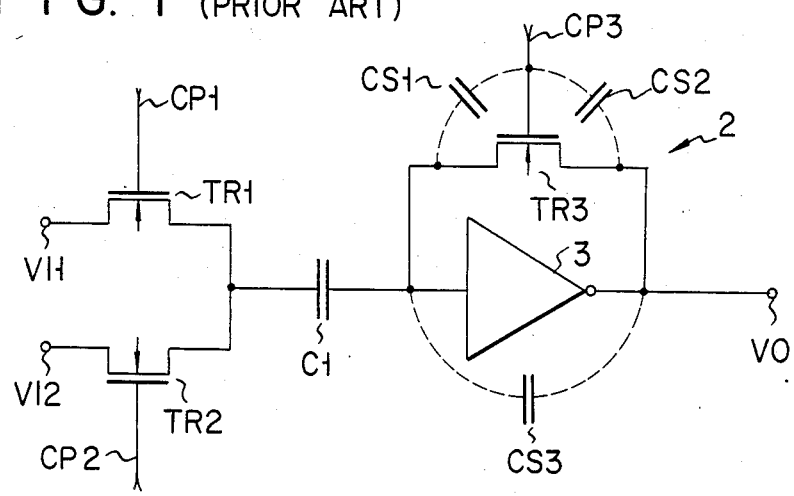
FIG. 1 is a view of a conventional chopper type voltage comparison circuit.
Figure 2:
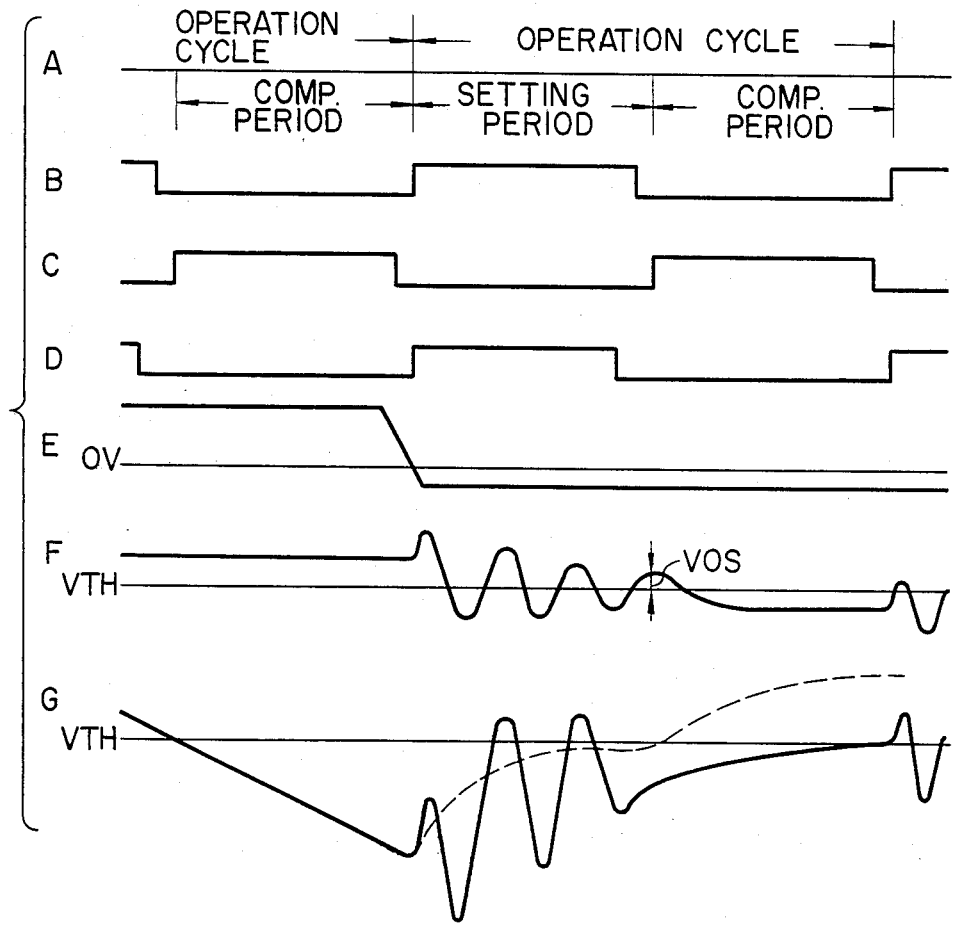
FIGS. 2A to 2G show signal waveforms for explaining the operation of the voltage comparison circuit shown in FIG. 1.
Figure 4:
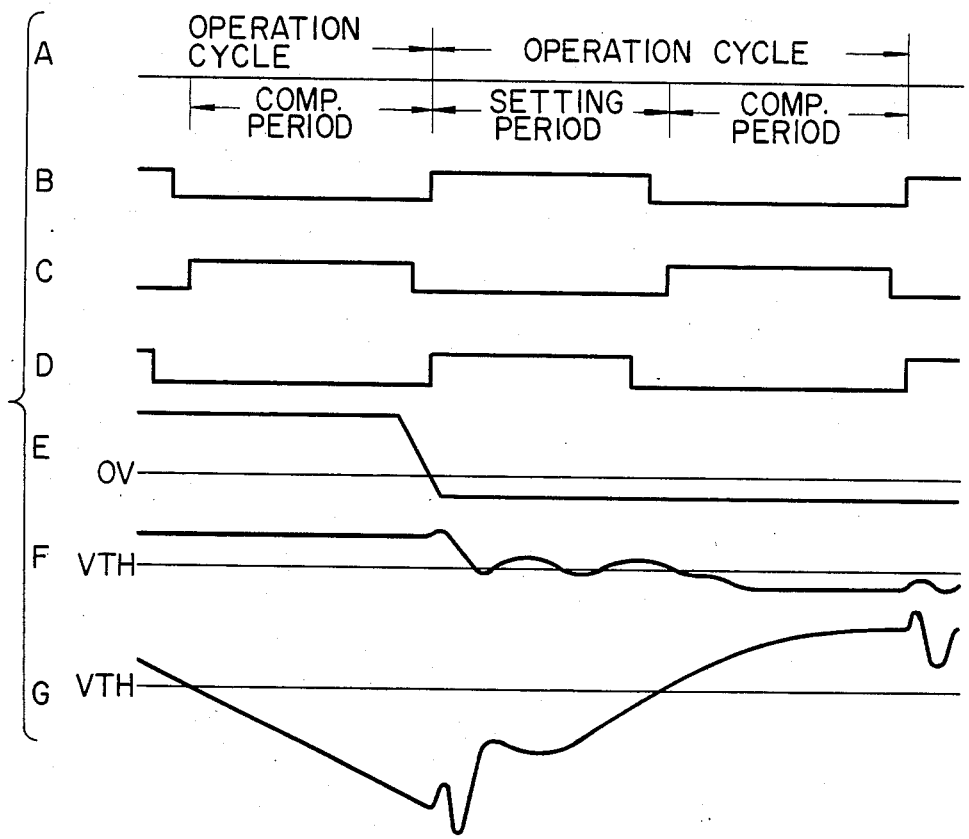
FIGS. 4A to 4G show signal waveforms for explaining the operation of the voltage comparison circuit shown in FIG. 3.

The operation principle of the voltage comparison circuit shown in FIG. 3 is the same as that shown in FIG. 1. That is, each operation cycle of the voltage comparison circuit is, as shown in FIG. 4A, divided into two periods, i.e., an operation point setting period and a voltage comparison period. The gates of the MOS transistors TR1, TR2 and TR4 are respectively supplied with clock signals CP1, CP2 and CP4 shown in FIGS. 4A, 4B and 4C which have the same phase relationships therewith as the clock signals shown in FIGS. 2A, 2B and 2C.

At the starting time during the operation point setting period, each of the MOS transistors TR1 and TR4 is rendered conductive in response to respective clock signals CP1 and CP4, the capacitor C1 is charged by an input voltage V1, the input and the output terminals of the inverting amplifier 5 are connected with each other through the first low-pass filter 6, the MOS transistor TR4 and the second low-pass filter 7, and the potentials at the input and the output terminals of the inverting amplifier 5 converge with the inversion threshold voltage value VTH.

Next, during the voltage comparison period in response to the clock signal CP2, the MOS transistor TR2 becomes conductive, the capacitor C1 is supplied with the input voltage V2 and is charged in accordance with a voltage difference between the input voltages V1 and V2.

In the voltage comparison circuit shown in FIG. 3, when the clock signal CP4 is set to a high level, a ripple component generated at the rise time of the clock signal CP4 is transmitted by feed through effect to the drain and source of the MOS transistor TR4 through the parasitic capacitances CS4 and CS5, respectively. However, the ripple component is filtrated off or attenuated sharply by the first and the second low-pass filters 6 and 7, so that the ripple component will hardly be transmitted to the input and the output terminals of the inverting amplifier 5.

Further, the output signal of this inverting amplifier 5 is fed to the input terminal of this inverting amplifier 5 via the second low-pass filter 7, the MOS transistor TR4 and the first low-pass filter 6, accordingly, oscillatory components included in the output signal of this inverting amplifier 5 are filtrated off or sharply attenuated by the second and first low-pass filters 7 and 6, so that the ripple component having large amplitude can not be included in the input signal to the inverted amplifier 5.

Accordingly, as shown in FIG. 4E, even if the voltage difference between the input voltages V1 and V2 changes from +10 mV to −3 mV, the input voltage of the inverting amplifier 5 converges during the operation point setting period, as shown in FIG. 4F, with the inversion threshold voltage value VTH. In this case, as shown in FIG. 4G, the output voltage of the inverting amplifier 5 also converges quickly to the inversion threshold voltage value VTH. In consequence during the succeeding voltage comparison period, as shown in FIG. 4F, an input voltage supplied to the inverting amplifier 5 converges to a level corresponding to a voltage difference VD, and an output voltage is obtained from the inverting amplifier 5, as shown in FIG. 4G, by inverting and amplifying the input voltage.

The output voltage from the inverting amplifier 5 is fed back to the input terminal of the inverting amplifier 5 through the second and first low-pass filters 7 and 6, so that the ripple component included in the input voltage to the inverting amplifier 5 can be sharply suppressed. As mentioned above, the input and the output voltages of the inverting amplifier 5 converge, as shown respectively in FIGS. 4F and 4G, smoothly and quickly to preset levels.

Figure 5:
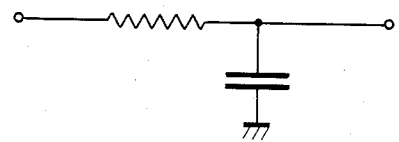
FIGS. 5 and 6 show modified examples of filter circuits used in the amplification circuit shown in FIG. 3.
Figure 6:
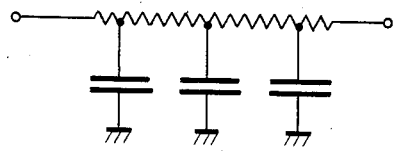

FIGS. 5 and 6 show modified examples for each of the first and second low-pass filters 6 and 7 used in the voltage comparison circuit shown in FIG. 3. In FIG. 5 there is shown a CR filter circuit comprising a resistor connected between two terminals and a capacitor connected between the ground and a node which lies between the inverting amplifier 5 and the resistor.

In FIG. 6 there is also shown a CR filter circuit comprising a resistor connected between two terminals and a plurality of capacitors each of which is connected between a corresponding node of the resistor and ground.

Figure 7:
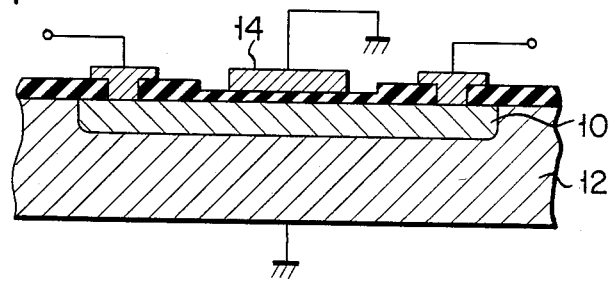
FIGS. 7 to 9 are sectional views of a semiconductor device constituting a filter circuit capable of being used in the amplification circuit shown in FIG. 3.
Figure 9:
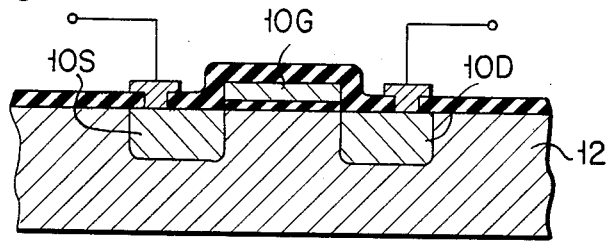

In FIGS. 7 and 9 there are shown semiconductor devices constituting the CR filter circuits shown in FIGS. 5 and 6.

The CR filter shown in FIG. 7 is constituted by a diffusion layer 10 formed in the surface area of a grounded semiconductor substrate 12 and has an opposite conductivity type to that of the substrate 12, the diffusion layer 10 acting as a resistor, and a grounded conductive layer 14 formed insulatively on the diffusion layer 10.

In this CR filter input and output electrodes are formed in contact with end portions of the diffusion layer 10. Accordingly, the junction capacitor formed between the diffusion layer 10 and the semiconductor substrate 12 and a capacitor formed of the conductive layer 14 and the diffusion layer 10 are connected between the resistor formed of the diffusion layer 10 and ground.

Figure 8:
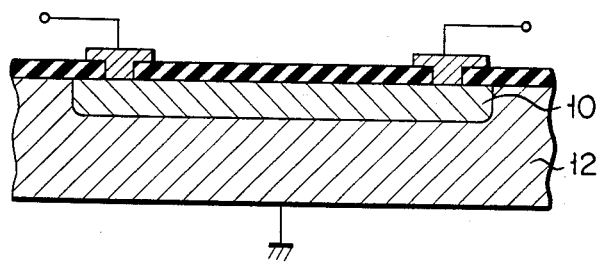

A CR filter shown in FIG. 8, except for the conductive layer 14, is similar to that shown in FIG. 7. In this case only a junction capacitor formed between the diffusion layer 10 and the semiconductor substrate 12 is connected between the diffusion layer 10 which serves as a resistance and ground.

A CR filter shown in FIG. 9 is provided with source and drain regions 10S and 10D formed in the surface area of the semiconductor substrate 12 and having an opposite conductivity type to that of the semiconductor substrate 12 and a gate electrode 10G formed insulatively on a portion of the semiconductor substrate 12 between the source and drain regions 10S and 10D.

A channel formed by applying a predetermined gate voltage to the gate electrode 10G is used as a resistive component, and the junction capacitor between the source and drain regions 10S and 10D and the substrate 21 is used as a capacitance component.

When the third clock signal CP3 is set to the high level in the voltage comparison circuit shown in FIG. 3, in order to make the cut-off frequencies of those CR filters shown in FIGS. 7, 8 and 9 higher than the fluctuating frequency of the input voltage applied to the inverting amplifier 5, time constants of those CR filters are set, for example, to the degree from a few nanoseconds to several hundred nanoseconds. Further, it is possible to utilize a parasitic capacitance existing between the gate and substrate of an MOS transistor comprising an inverting amplifier 5.

Accordingly, when practically forming such a voltage comparison circuit as shown in FIG. 3, there are many parasitic capacitances, and there are many cases in which only formation of a resistance element is needed for composing a CR filter by utilizing the aforementioned parasitic capacitances. Further, instead of forming this resistance element with a diffusion region, for example, it is also possible to form a CR filter with a polycrystalline silicon layer or the like formed insulatively on a semiconductor substrate.

Heretofore, the present invention is described with reference to one embodiment, however, the present invention is not limited to this embodiment at all. For example, in the voltage comparison circuit shown in FIG. 3, the low-pass filters 6 and 7 are used to eliminate ripple components included in a damped oscillatory signal generated by a combination of effects of the parasitic capacitor CS6 between the input and output terminals of the inverting amplifier 5 and the amplification function thereof, and it may be also possible to eliminate either one of low-pass filters 6 and 7. In this case a ripple component included in the clock signal C4 will be transmitted to the input or the output terminal of the inverting amplifier 5 through the parasitic capacitance CS4 or CS5. However, when the output signal of the inverting amplifier 5 is passed through the low-pass filter 6 or 7, the ripple component included in the output signal is suppressed, causing no problem.

It is also possible to use a p-channel MOS transistor or a bipolar transistor instead of the n-channel MOS transistor TR4. Further, the inverting amplifier 5 may be composed of depletion and enhancement type MOS transistors.

What we claim is:
1. An amplification circuit comprising:
a signal input terminal and signal output terminal;

amplifying means having input and output terminals and including a CMOS inverter having MOS transistors of different channel types, said output terminal being coupled to said signal output terminal;

at least one switching MOS transistor whose current path is connected between said signal input terminal and said output terminal of said amplifying means and whose gate is connected to receive a clock signal to set an operation point of said amplifying means; and a first low-pass filter connected between said switching MOS transistor and said input terminal of said amplifying means;

a second low-pass filter connected between said switching transistor and said output terminal of said amplifying means; and wherein each of said first and second low-pass filters includes a CR filter comprising a semiconductor substrate, an impuirty layer functioning as resistance means and capacitance means, said impurity layer having a conductivity type opposite to that of said semiconductor substrate and being formed in a surface area of said semiconductor substrate.

* * * * *